US011869973B2

(12) United States Patent
Thompson et al.

(10) Patent No.: US 11,869,973 B2
(45) Date of Patent: Jan. 9, 2024

(54) NANOWIRE TRANSISTOR STRUCTURE AND METHOD OF SHAPING

(71) Applicant: INTEL CORPORATION, Santa Clara, CA (US)

(72) Inventors: Erica J. Thompson, Beaverton, OR (US); Aditya Kasukurti, Hillsboro, OR (US); Jun Sung Kang, Portland, OR (US); Kai Loon Cheong, Beaverton, OR (US); Biswajeet Guha, Hillsboro, OR (US); William Hsu, Hillsboro, OR (US); Bruce Beattie, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1220 days.

(21) Appl. No.: 16/013,329

(22) Filed: Jun. 20, 2018

(65) Prior Publication Data
US 2019/0393350 A1 Dec. 26, 2019

(51) Int. Cl.
*H01L 29/78* (2006.01)
*H01L 29/06* (2006.01)
(Continued)

(52) U.S. Cl.
CPC ...... *H01L 29/7853* (2013.01); *H01L 29/0673* (2013.01); *H01L 29/1037* (2013.01);
(Continued)

(58) Field of Classification Search
CPC ............ H01L 29/7853; H01L 29/0673; H01L 29/1037; H01L 29/1054; H01L 29/6653; H01L 29/6681; H01L 29/66818; H01L 29/7855; H01L 21/02238; H01L 21/02241; H01L 21/31111; H01L 21/31122; H01L 29/165; H01L 29/205; H01L 29/42392; H01L 29/1033; H01L 29/66439;
(Continued)

(56) References Cited

U.S. PATENT DOCUMENTS 8,617,348 B1 12/2013 Liu et al.
8,648,330 B2 2/2014 Bangsaruntip et al.
(Continued)

FOREIGN PATENT DOCUMENTS

WO 2018063300 A1 4/2018

OTHER PUBLICATIONS

European Extended Search Report for European Application No. 19173119.9 dated Dec. 3, 2019, 9 pages.
(Continued)

*Primary Examiner* — Mohammed R Alam
(74) *Attorney, Agent, or Firm* — Schwabe, Williamson & Wyatt, P.C.

(57) ABSTRACT

A nanowire device includes one or more nanowire having a first end portion, a second end portion, and a body portion between the first end portion and the second end portion. A first conductive structure is in contact with the first end portion and a second conductive structure is in contact with the second end portion. The body portion of the nanowire has a first cross-sectional shape and the first end portion has a second cross-sectional shape different from the first cross-sectional shape. Integrated circuits including the nanowire device and a method of cleaning a semiconductor structure are also disclosed.

15 Claims, 5 Drawing Sheets

(51) Int. Cl.
- *H01L 29/10* (2006.01)
- *H01L 29/66* (2006.01)
- H01L 21/02 (2006.01)
- H01L 21/311 (2006.01)
- H01L 29/165 (2006.01)
- H01L 29/205 (2006.01)
- H01L 29/423 (2006.01)

(52) U.S. Cl.
CPC ...... *H01L 29/1054* (2013.01); *H01L 29/6653* (2013.01); *H01L 29/6681* (2013.01); *H01L 29/66818* (2013.01); *H01L 29/7855* (2013.01); H01L 21/02238 (2013.01); H01L 21/02241 (2013.01); H01L 21/31111 (2013.01); H01L 21/31122 (2013.01); H01L 29/165 (2013.01); H01L 29/205 (2013.01); H01L 29/42392 (2013.01)

(58) Field of Classification Search
CPC ............. H01L 29/775; H01L 21/02057; H01L 29/0657; H01L 29/0843; H01L 29/42316; B82Y 10/00; B82Y 30/00
See application file for complete search history.

(56) References Cited

U.S. PATENT DOCUMENTS

| | | | |
|---|---|---|---|
| 2009/0090934 A1 | 4/2009 | Tezuka et al. | |
| 2010/0252815 A1 | 10/2010 | Chidambarrao et al. | |
| 2012/0168711 A1 | 7/2012 | Crowder et al. | |
| 2014/0001441 A1* | 1/2014 | Kim .................. | H01L 21/31155 257/29 |
| 2014/0191321 A1 | 7/2014 | Cheng et al. | |
| 2014/0210013 A1* | 7/2014 | Kim ................ | H01L 21/823412 257/369 |
| 2014/0353574 A1* | 12/2014 | Li ...................... | H01L 29/7841 438/284 |
| 2017/0200738 A1 | 7/2017 | Kim et al. | |

OTHER PUBLICATIONS

Office action from European Patent Application No. 19173119.9, dated Oct. 28, 2021, 6 pgs.
Henry H. Radamson et al., "The Challenges of Advanced CMOS Process from 2D to 3D", Applied Sciences, Oct. 13, 2017, 32 pages.
Alex Mathew, "Development of Nanowire Device for Microscopic Detection of Cancer Biomarkers in Urine", Coherent News, Jan. 25, 2018, 2 pages.
Koji Araki et al., "Effect of Reflow Oxidation on Si Surface Roughness During High-Temperature Annealing", The Japan Society of Applied Physics, Jun. 22, 2009, 1 page.
"Exploring Roundness, A Fundamental Guide to the Measurement of Cylindrical Form", Ametek Ultra Precision Technologies, Taylor Hobson, 3rd Edition, Nov. 2011, 102 pages.
B.E.E. Kastenmeier et al., "Highly Selective Etching of Silicon Nitride Over Silicon and Silicon Dioxide", J. Vac. Sci. Technol., Nov./Dec. 1999, 6 pages.
B.E.E. Kastenmeier et al., "Highly Selective Etching of Silicon Nitride Over Silicon and Silicon Dioxide", Journal of Vacuum Science and Technology, 1999, 2 pages.
Hyosan Lee et al., "A Study on Selective SiGe Etch for Three-Dimensional Si Structure Application", 208th ECS Meeting, downloaded on May 18, 2018, 1 page.
Wei Wang et al., "Digital Etch Technique for Forming Ultra-Scaled Germanium-Tin (Ge1-xSnx) Fin Structure", Scientific Reports, May 12, 2017, 9 pages.
Thomas Mikolajick et al., "Silicon Nanowires: Fabrication and Applications", Chapter 1, Springer International Publishing, 2015, 26 pages.
A. Veloso et al., "Challenges on Surface Conditioning in 3D Device Architecture: Triple-Gate FinFETs, Gate-All-Around Lateral and Vertical Nanowire FETs", ECS Transactions, Aug. 2017, 16 pages.

* cited by examiner

Section A-A

Section B-B

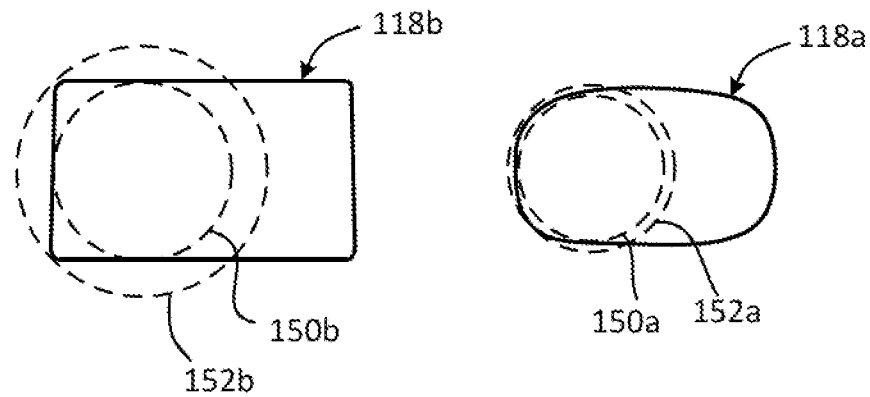
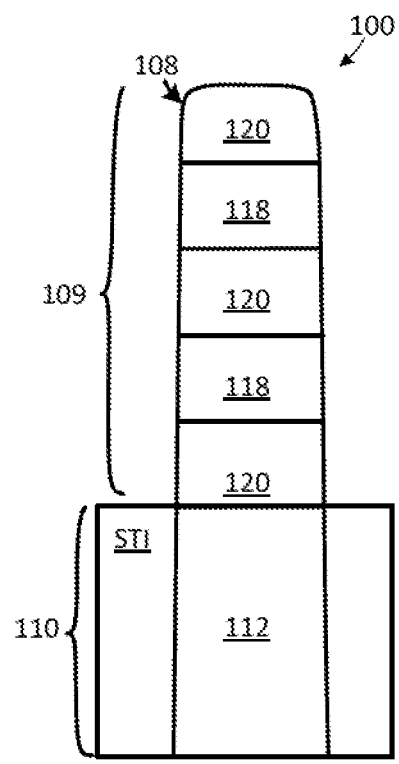 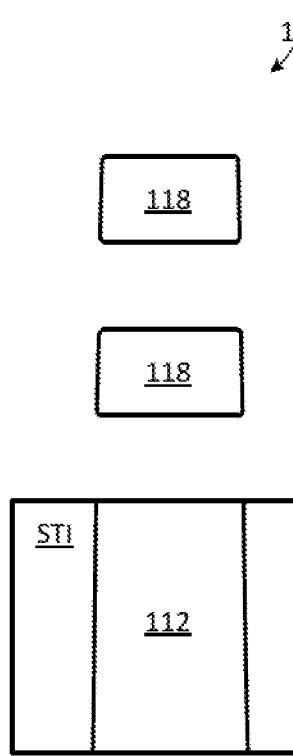 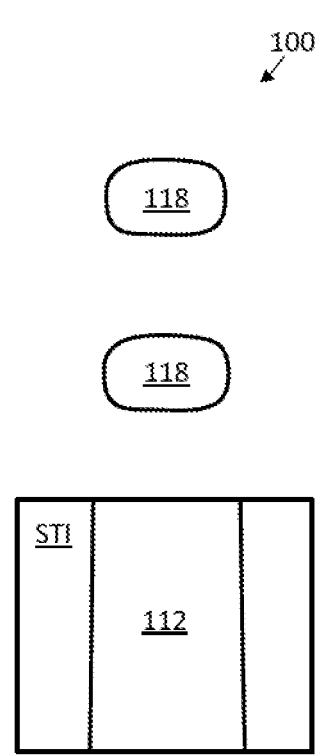

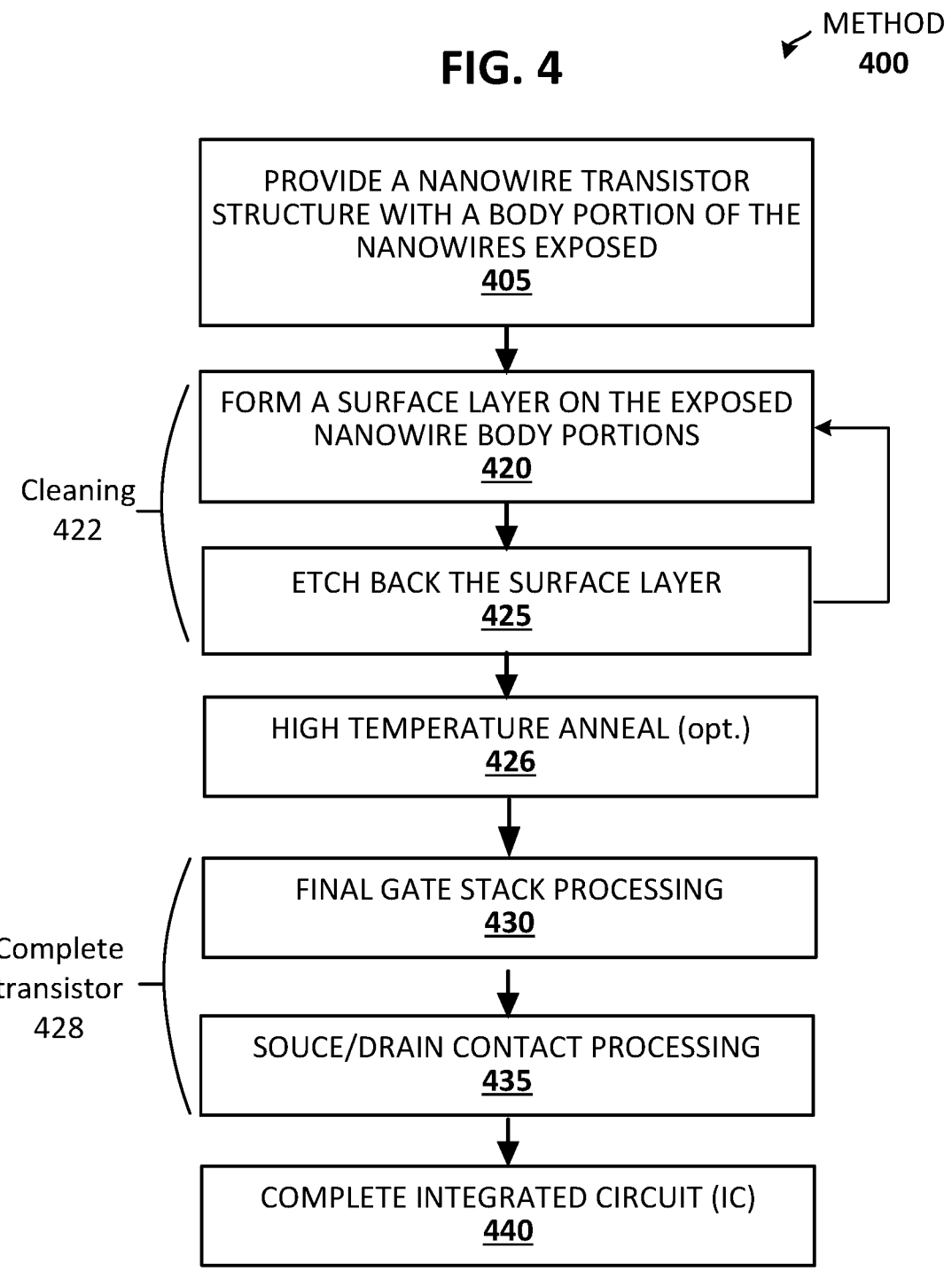

NANOWIRE TRANSISTOR STRUCTURE AND METHOD OF SHAPING

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. A nanowire transistor (sometimes referred to as a gate-all-around (GAA) or nanoribbon transistor) is configured similarly to a fin-based transistor, but instead of a finned channel region with the gate is contact with three sides of the fin, one or more nanowires extend between the source and the drain regions. In nanowire transistors the gate material generally surrounds or encircles each nanowire (hence, gate-all-around).

BRIEF DESCRIPTION OF THE DRAWINGS

FIG. 2C illustrates an example of evaluating roundness based on the difference between the diameters of the maximum inscribed circle and minimum circumscribed circle for a nanowire end portion and a nanowire body portion, in accordance with an embodiment of the present disclosure.

FIG. 3A illustrates a cross-sectional view of a semiconductor fin showing a layer stack of channel material and sacrificial material prior to releasing nanowires, in accordance with an embodiment of the present disclosure.

FIG. 3B illustrates a cross-sectional view taken through the nanowire body portion after releasing the of the nanowires from the layer stack of FIG. 3A, where the nanowires have a generally rectangular cross-sectional shape, in accordance with an embodiment of the present disclosure.

FIG. 3C illustrates a cross-sectional view taken through the nanowire body portion of FIG. 3B after one to three cycles of oxidation and oxide etch back to result in a more rounded cross-sectional shape, in accordance with an embodiment of the present disclosure.

FIG. 4 is a flow chart showing processes in a method of cleaning a semiconductor device structure, in accordance with an embodiment of the present disclosure.

Figure 1:
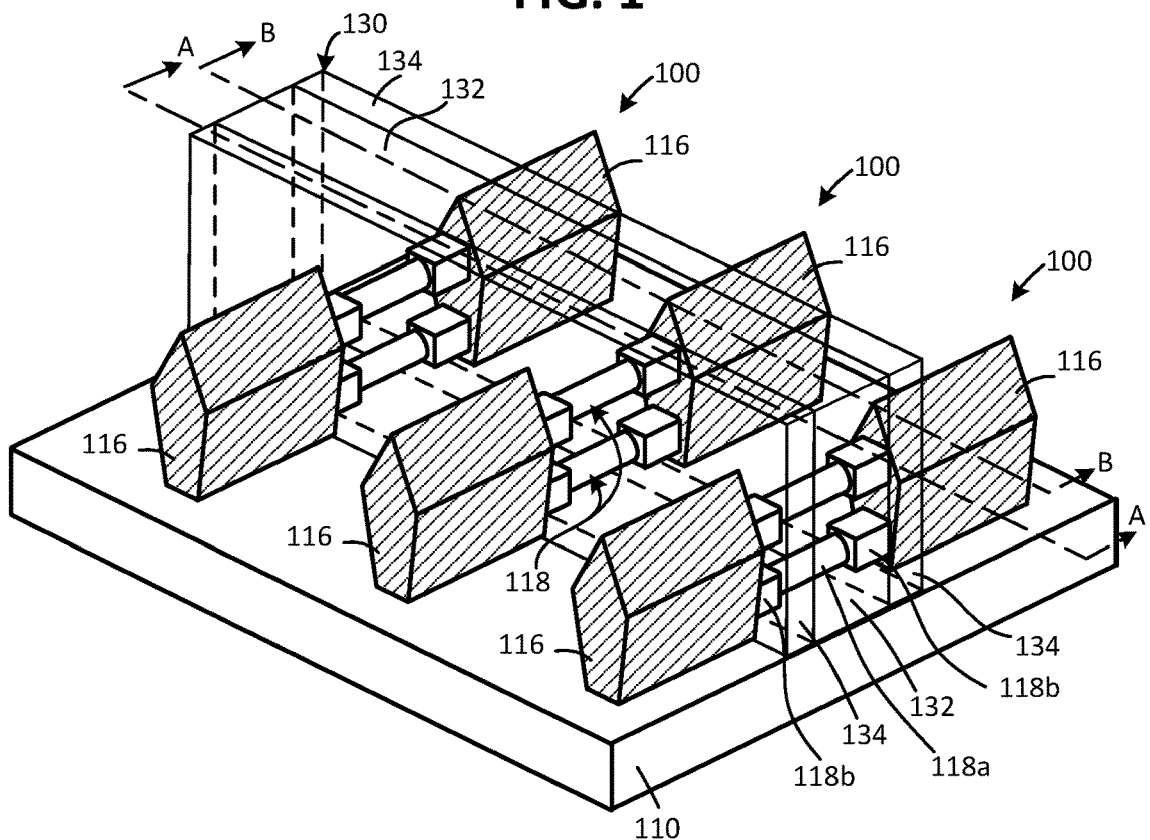
FIG. 1 illustrates a perspective view of a nanowire transistor structure, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed for shaping semiconductor structures, particularly with respect to shaping the gated portion of nanowires and nanoribbons, although other semiconductor structures may benefit from the shaping techniques, as will be appreciated. In one embodiment, released nanowires/nanoribbons are rounded atomically using a controlled isotropic dry and/or wet etch. In another embodiment, released nanowires/nanoribbons are rounded by subjecting them to sequential treatment of oxidation and oxide etch back. Oxidation process can be atomically controlled, either ex-situ or in-situ using an etch chamber. In another embodiment, released nanowires are subjected to an annealing process to reflow corners into more rounded shape. Some such post-release processing produces not only rounded edges, but can also produce a minimal surface roughness and clean away residual undesired materials. The semiconductor material comprising the nanowire/nanoribbon or other feature being shaped can be any suitable semiconductor material, including but not limited to group IV semiconductor materials (e.g., silicon, germanium, and silicon germanium) and group III-V semiconductor materials (e.g., gallium nitride, indium gallium arsenide, gallium arsenide). Numerous configurations will be apparent.

In accordance with one such embodiment, one or more cycles of digital etch are performed after releasing the nanowires to clean and shape the surface of the exposed nanowire body portion. For example, released nanowires are rounded by subjecting them to sequential treatment of oxidation and oxide etch-back. The oxidation process can be atomically controlled, either ex-situ or in-situ using an etch chamber, for example. One such etch process is a controlled isotropic dry or wet etch. In some such embodiments, the released nanowires can optionally be subjected to an annealing process to reflow corners into a more rounded shape. In some specific examples of such embodiments, for instance, the digital etch process is useful to remove trace silicon germanium left behind from a sacrificial material layer above and/or below a silicon nanowire.

Accordingly, nanowires with a rectangular or trapezoidal cross-sectional shape can be cleaned and shaped to have a rounded cross-sectional shape with reduced surface roughness, according to some embodiments. As will be appreciated, a similar digital etch process or "cleaning/shaping" cycle can be performed on other structures, including field layers, blocks, and the like. Where the structure includes a corner, point, protrusion, or the like, the cleaning/shaping process can be useful in some embodiments to level high spots and round corners.

In one example embodiment, a nanowire device includes one or more nanowires that have a first end portion, a second end portion, and a body portion between the first end portion and the second end portion. A first conductive structure in contact with the first end portion and a second conductive structure in contact with the second end portion. For example, the first and second conductive structures are source/drain regions of a transistor device. In another example, the conductive structure is a contact or metal structure, such as in a sensor or other semiconductor device. The body portion has a first cross-sectional shape and the first end portion has a second cross-sectional shape different from the first cross-sectional shape. For example, the body portion has a more rounded shape and smaller circumference compared to the end portion, which has a more rectangular shape. Note, however, that the body portion is continuous with the end portion. In this manner, the nanowire, nanoribbon, or other feature that includes the body and end portions has more than one distinct cross-sectional shapes, depending on where the cross-section view is taken.

Methodologies and structures of the present disclosure can provide an improved nanowire interface prior to deposition of a gate dielectric and metal gate, according to some embodiments. Accordingly, such methodologies can improve transistor mobility and reliability, in some such cases. Numerous variations, embodiments, and applications will be apparent in light of the present disclosure.

General Overview

Field effect transistors (FETs) have been scaled to smaller and smaller sizes to achieve faster circuit operation. Such scaling has resulted in the development of the nanowire and nanoribbon transistors or gate-all-around (GAA) transistors. For example, the GAA channel region can have one or more nanowires extending between the source and drain regions, such as a vertical stack of nanowires that extend horizontally between the source and drain regions. In one example methodology, alternating layers of silicon (Si) and silicon germanium (SiGe) are formed on a bulk silicon substrate. The resulting structure is then etched to define a fin that includes a silicon subfin and alternating layers of SiGe and Si on top of the subfin. The SiGe is then removed, such as by a gas-phase chlorine trifluoride ($ClF_3$) etch, to release silicon nanowires extending between and connecting the source and drain regions of the fin. A similar process can be used to remove the silicon to release SiGe nanowires, and for other material combinations, such as gallium (Ga) and gallium arsenide (GaAs).

One challenge of nanowire processing is that the released nanowire can have relatively sharp corners that cause poor gate-metal fill and limit the scaling gap between adjacent nanowires. Sharp corners can also increase the electric field and reduce device reliability, by causing charge accumulation and current leakage. Another challenge is that during the epitaxial formation of the Si and SiGe layers, for example, a germanium concentration gradient is created in the silicon nanowires due to germanium remaining in the epitaxial chamber between shutting off the supply of germanium to the chamber and the time when the germanium has been evacuated from the chamber. This concentration gradient can cause germanium diffusion into the silicon at a low level. The germanium concentration in the silicon layers can be low enough that the etch used to release the nanowires does not remove the residual germanium. Despite otherwise thorough cleaning and an aggressive etch chemistry (e.g., ClF3) the residual germanium is not removed completely and can behave like a dirty interface that reduces performance of the device. Yet another challenge in nanowire processing results from variation in the cross-sectional shape of the nanowires and variation in the cross-sectional size and/or shape from nanowire to nanowire (e.g., some are square, some are trapezoidal, and some are rectangular). Such irregular geometry can result in differences in carrier mobility and device current, for example. These and other challenges can reduce device performance or result in inconsistent device performance.

Thus, and in accordance with various embodiments of the present disclosure, techniques are provided for shaping nanowires in transistor structures. In one embodiment, an etch process is employed to improve the geometry of nanowires in transistor structures in a controlled and predictable way. In some such embodiments, etch techniques can be used to provide reproducible atomic layer etching with tunable process parameters. In some such embodiments, a wet chemistry etch is provided for atomic layer etching of semiconductor materials, including gate-all-around channel structures. The etching may be accompanied by oxidation and/or annealing. In some cases, annealing is used to reflow sharp corners.

In one embodiment, a transistor device processed in accordance with the present disclosure includes a nanowire channel region. For example, the channel region has a plurality of silicon nanowires stacked vertically and extending horizontally between a source and drain region, although any semiconductor materials can be used and the present disclosure is not intended to be limited to any specific material unless expressly claimed. End portions of the nanowires adjacent the source and drain regions (e.g., a nanowire end portion that is surrounded by a gate spacer material) exhibit a different cross-sectional geometry than a body portion of the nanowire (e.g., a gate portion that is surrounded by the gate dielectric and gate electrode). For example, the end portions of nanowires in a given device may have a more rectangular shape and an overall larger size compared to a more rounded shape and smaller size along the body portion. Additionally, the body portion may be free of germanium within the limit of detection using transmission electron microscopy (TEM), while the end portions have detectable levels of residual germanium.

As used herein, the term "nanowire" is not limited to structures of a particular cross-sectional shape, but includes structures of a rectangular, square, trapezoidal, "racetrack" (e.g., parallel sides connected by rounded ends), circular, oval, elongated, and other cross-sectional shapes, some of which may be referred to as nanoribbons or beaded-fins. Specifically, in accordance with some embodiments, a nanowire is a structure that has a thickness or diameter on the order of tens of nanometers or less, and an unconstrained length. A nanowire can be made of semiconducting material, a semiconducting metal oxide, a metal, or a carbon nanotube. Further note that the term "end" as used herein with respect to nanowires or nanoribbons need not be the absolute or terminal end of a given length. Rather, the end may simply refer to a portion of that nanowire/nanoribbon that includes a source or drain region. For instance, in cases where the source/drain region is continuous with the channel region, such as the case where the source/drain regions are doped portions of the multilayer structure from which the nanowires are formed, the "end" may refer to the portion of the nanowire/nanoribbon that includes the source/drain region as well as the region under the gate spacer (if a gate spacer if present). In such cases, the channel region has a first cross-sectional shape (rounded corners) and the remainder of the nanowire/nanoribbon, including the source/drain regions and any portion of the nanowire/nanoribbon within a gate spacer (if present), has a second shape (e.g., sharp corners). In other cases, such as in cases where the source/drain regions are replacement or epitaxial source/drain regions, the end may be the portion of the nanowire/nanoribbon within the gate spacer and/or between the source/drain region and the channel region.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

In some embodiments, a plurality of channel layers of compositionally different channel materials or geometries may be formed on different areas of the substrate, such as for CMOS applications, for example. For instance, a first channel material layer may be formed on a first area of a silicon base to be used for one or more p-channel transistor devices (e.g., one or more PMOS devices) and a second channel material layer may be formed on a second area of the silicon base to be used for one or more n-channel transistor devices (e.g., one or more NMOS devices). As previously described, by selecting the substrate to have the desired material characteristics (e.g., the desired semiconductor material, the desired dopant concentration, and desired dopant type) the substrate can be used to grow multiple different channel layers.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

In some embodiments, the techniques described herein can be used to benefit n-channel devices (e.g., NMOS) and/or p-channel devices (e.g., PMOS). Further, in some embodiments, the techniques described herein can be used to benefit MOSFET devices, FinFET devices, and/or any other suitable devices as will be apparent in light of this disclosure. Further still, in some embodiments, the techniques described herein can be used to form complementary transistor circuits (such as CMOS circuits), where the techniques can be used to benefit one or more of the included n-channel and p-channel transistors making up the CMOS circuit. Further yet, in some embodiments, the techniques described herein can be used to benefit a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., beaded-fin configurations), to provide a few examples. In addition, in some embodiments, the techniques can be used for a variety of source/drain (S/D) configurations, such as replacement material S/D, cladded S/D, and/or any other suitable S/D configuration as will be apparent in light of this disclosure. The techniques described herein may be used to benefit logic transistor devices or transistor-based devices used for other suitable applications (e.g., amplification, switching, etc.). Therefore, the techniques described herein can be used to benefit a multitude of transistor devices.

In general, the techniques allow transistors to be further scaled with diverse channel materials, while ensuring higher operating voltage, higher drive currents, and thereby improved performance. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate a transistor with a nanowire channel region, where the gate or body portion has a different cross-sectional geometry compared to the end portions in contact with the gate spacer. For example, TEM can be useful to show a cross section of the device structure. In another example, x-ray crystallography can be useful to illustrate the crystal quality of the active channel material. X-ray crystallography may be used to illustrate the presence of germanium in the end portions of a nanowire, but a body portion that is free of germanium. In some embodiments, the techniques described herein may be detected based on the benefits derived from their use, which includes channel materials with improved shapes, reduced impurities, improved carrier mobility, relatively higher operating voltage, relatively higher drive currents, and/or other improved device performance. Numerous configurations and variations will be apparent in light of this disclosure.

Architecture and Methodology

FIG. 1 illustrates a perspective view of example nanowire transistor structures 100 formed on a substrate 110. Each transistor structure 100 includes a nanowire channel region 114 extending between and connecting source/drain regions 116. As shown in this example, the channel region 114 of each transistor structure 100 includes one or more nanowires 118 that extend horizontally and are arranged in a vertical stack. Although two nanowires 118 are illustrated, the channel region 114 can have one nanowire 118 or can have three or more nanowires 118. Similarly, the transistor structures 100 of FIG. 1 illustrate a transistor with nanowires 118 that extend horizontally and are stacked vertically; however, the present disclosure contemplates nanowires 118 in a variety of configurations that include planar nanowire transistors, nanowires that extend vertically, and other arrangements, as will be appreciated. Further, the gate structure 130 of FIG. 1 is illustrated as being transparent in order to show the geometry of the nanowires 118. However, the illustration is not limiting and the materials used to form the gate structure 130 are not necessarily transparent.

In the example structure of FIG. 1, each nanowire 118 includes a nanowire body portion 118a extending between nanowire end portions 118b. The nanowire end portions 118b contact the material of the source/drain regions 116. As shown in the example structure of FIG. 1, the source and drain regions 116 have undergone further processing from the original fin shape, which may include a replacement material approach or other processing, as will be appreciated. A gate structure 130 contacts and surrounds the body portion 118a of each nanowire 118 between the source and drain regions 116. In one embodiment, the gate structure 130 includes a gate dielectric 136 (not visible; shown in FIGS. 2A-2B) that wraps around each nanowire 118, and a gate electrode 132 in contact with the gate dielectric. The gate structure 130 also includes gate spacers 134 that extend along the sides of the gate electrode 132 to isolate the gate electrode 132 from the source and drain regions 116. The gate spacers 134 surround the nanowire end portions 118b and are located between the gate electrode 132 and the source and drain regions 116. The nanowire body portion 118a under the gate electrode 132 has a different cross-sectional shape and/or size compared to the nanowire end portions 118b beneath the gate spacers 134. For example, the cross-sectional shape of the nanowire body portion 118a is more rounded (e.g., having a racetrack shape or circular shape) compared to the cross-sectional shape of the nanowire end portions 118b (e.g., having a rectangular or square shape).

Figure 2A:
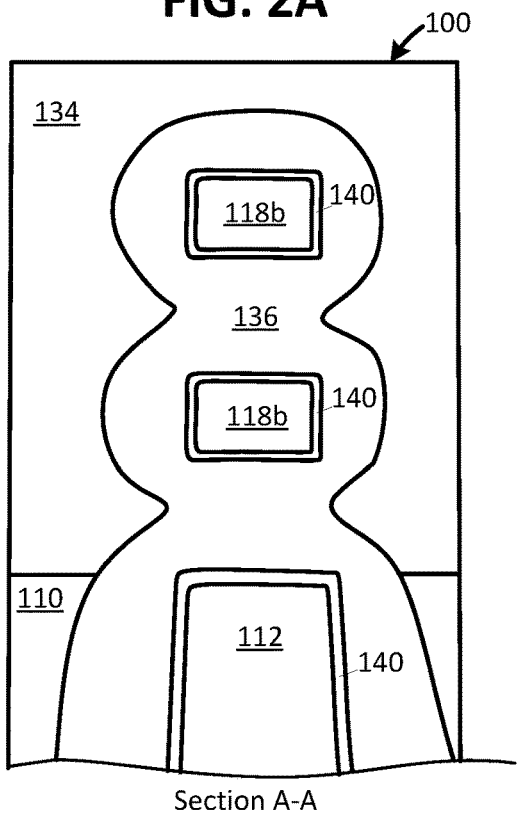
FIG. 2A illustrates a cross-sectional view of one nanowire structure of FIG. 1 as taken through the nanowire end portion along line A-A, in accordance with an embodiment of the present disclosure.
Figure 2B:
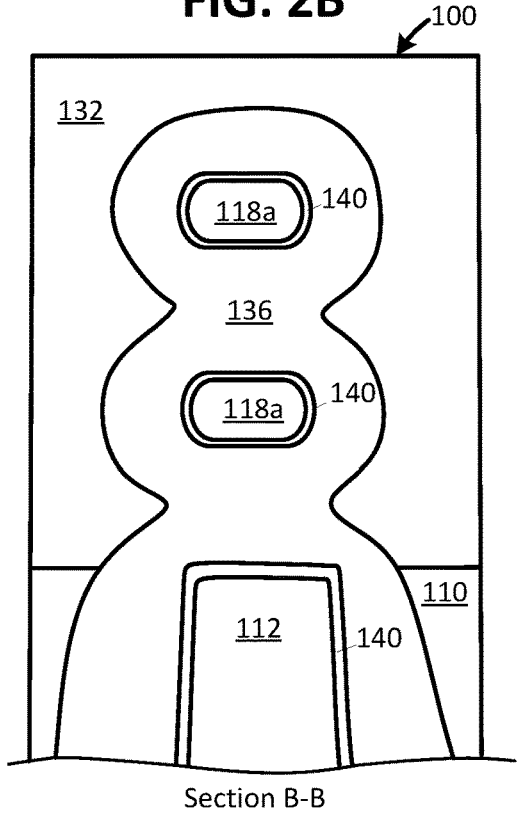
FIG. 2B illustrates a cross-sectional view of one nanowire structure of FIG. 1 as taken through the nanowire end portion along line B-B, in accordance with an embodiment of the present disclosure.

Referring now to FIGS. 2A and 2B, cross-sectional views show part of one example transistor structure 100 of FIG. 1. FIG. 2A is a cross-sectional view of one transistor structure 100 taken through the gate spacer 134 and the nanowire end portions 118b along line A-A of FIG. 1. In this example, the nanowire end portions 118b are spaced from and aligned above a subfin 112 in a base or substrate 110 layer. Each nanowire end portion 118b is surrounded by material of the gate dielectric 136 and the gate electrode 132. The subfin 112 can be, for example, bulk semiconductor material on which blanket layers of channel material and sacrificial material are formed as part of processing the nanowire channel region 114.

In this example, the nanowire end portions 118b have a generally rectangular cross-sectional shape. For example, the nanowire end portion 118b has a rectangular or square shape with slightly rounded corners. A rectangular shape may result, for example, from material layers and etch processing used to form the nanowire 118. For example, alternating blanket layers of channel material and sacrificial material are deposited on the substrate 110, followed by an anisotropic etch process to define a fin structure. The anisotropic etch proceeds through the blanket layers in a generally vertical direction, resulting in blocks of alternating materials in a vertical stack as viewed in the cross section. Using an isotropic etch process, the sacrificial material is subsequently removed to release the channel material, resulting in the nanowire 118 having a generally rectangular cross-sectional profile. Removal of the sacrificial material may slightly round the corners of the nanowire 118 in some cases, but the cross-sectional profile retains a generally rectangular shape. Thus, while FIG. 2A shows a cross-sectional view of the nanowire end portion 118b, it is also generally representative of the profile of the nanowires 118 along their length at this stage of processing. Example techniques for processing the transistor structure 100 are discussed in more detail below.

In some embodiments, the nanowire end portion 118 has a thin oxide layer 140 surrounding its circumference, although the oxide layer 140 is not required nor always present. The gate dielectric 136 conforms to and surrounds the circumference of each nanowire 118. Here, the gate dielectric 136 also contacts the top and sides of the subfin 112. In some embodiments having two nanowires, for example, the gate dielectric 136 can be described as having a figure-eight shape around the nanowires 118, where the nanowires 118 occupy the openings of the figure eight. In transistor structures 100 having three or more nanowires 118, for example, the gate dielectric can be described as a series of connected loops or a chain, where the nanowires 118 occupy the openings of the loops. In the example shown in FIG. 2A, the portion of the gate dielectric 136 surrounding the nanowire end portion 118b merges with or contacts the gate dielectric 136 on the subfin 112. In other embodiments, the portion of the gate dielectric 136 on the subfin 112 can be spaced from and distinct from the portion of gate dielectric 136 surrounding nanowires 118. For example, an intervening portion of the gate electrode 134 or other material occupies the gap between the gate dielectric 136 on the subfin 112 and the gate dielectric 136 on the bottom-most nanowire 118.

FIG. 2B shows the transistor structure 100 of FIG. 2A in a cross section as taken along line B-B of FIG. 1 through the gate electrode 132 and nanowire body portions 118a. The nanowire body portions 118a are vertically spaced from and aligned above the subfin 112. The gate dielectric 136 and the gate electrode 132 surround each nanowire body portion 118a. The gate electrode 132 is on the substrate 110 and surrounds the gate dielectric 136. In the example of FIG. 2B, the nanowire body portions 118a have an oval cross-sectional shape that results from post-release processing. Compared to the nanowire end portions 118b, for example, the nanowire body portions 118a are more rounded and have a reduced circumference. The more rounded shape may result, for example, from post-release digital etch processing used to clean and shape the nanowire body portion 118a after removal of a dummy gate electrode 132. In one example, the post-release etch processing involves an isotropic etch that removes material from a corner more rapidly than it removes material from a flat face. As a result, the isotropic etch processing tends to round the rectangular shape and reduce shape irregularities, as will be appreciated. In one example, the gate spacers 134 remain intact and protect the nanowire end portions 118b from the post-release etch processing. Example techniques for processing the transistor structure 100 are discussed in more detail below.

The nanowire body portion 118a has a more rounded shape compared to the nanowire end portions 118b. One method for measuring roundness is based on the difference between an external size defining a minimum circumscribed circle and an internal size defining a maximum inscribed circle. For example, the difference between the diameters of the minimum circumscribed circle and the maximum inscribed circle has a smaller value when the structure is more round (i.e., closer to being circular). In this example, the difference between the external size and the internal size is greater for the nanowire end portion 118b than for the nanowire body portion 118a.

An example illustrates the roundness measurement: for a square with a side of 1 unit, the diameter for the minimum circumscribed circle is $\sqrt{2}$ (~1.414 units) and for the maximum inscribed circle is 1.0 unit. Thus, the difference in diameter is 0.414 units (0.707 unit for radius). Rounding the corners of the square may reduce the difference in diameter to 0.2 units or less, for example. In some embodiments, the difference in diameter (or radius) between the external size and the internal size is reduced by at least 20%, including at least 30%, at least 50%, at least 60%, at least 70%, at least 80% or at least 90%.

In some embodiments, roundness is measured using a portion of the cross-sectional shape of the nanowire body portion 118a. For example, a nanowire 118 is configured as a nanoribbon having a cross-sectional width (e.g., 20 nm) that is five times the cross-sectional height (e.g., 4 nm). In such an instance, roundness is measured along 180° of a side of the cross-sectional shape that includes a 4-nm high×2-nm wide side portion of the overall cross-sectional shape, where a difference in the radius is considered for a minimum circumscribed arc of 180° and a maximum inscribed arc of 180° for the side portion.

FIG. 2C illustrates an example of a roundness comparison between cross-sectional views of portions of a nanowire 118. In the left side of FIG. 2C, a nanowire end portion 118b has a more rectangular shape. A maximum inscribed circle 150b is drawn as the largest circle that will fit inside the perimeter of the left-end portion of the rectangular shape. A minimum circumscribed circle 152b is concentric with the maximum inscribed circle and is the smallest circle that can be drawn around the outside of the left-end portion of the nanowire 118 cross section. Similarly, a maximum inscribed circle 150a and minimum circumscribed circle 150b are drawn for the nanowire body portion 118a that has been subjected to post-release oxidation and oxidation etch-back processing. By visual inspection, one can see that the difference in diameters of the inscribed and circumscribed circles 150b, 152b of the nanowire end portion 118b is greater than the difference in the diameters of the inscribed and circumscribed circles 150a, 152a of the nanowire body portion 118a.

By comparing the cross sections of nanowires 118 shown in FIG. 2A and FIG. 2B, one can determine that the perimeter length of the nanowire end portions 118b is greater than the perimeter length (e.g., circumference) of the nanowire body portions 118a. Also, the range of values for perimeter length (or the standard deviation in the perimeter length) is reduced among nanowire body portions 118a compared to the nanowire end portions 118b of one or more given transistor structure 100, in accordance with some embodiments. In one example, the perimeter lengths were measured for the nanowire end portions 118b and the nanowire body portions 118a in two transistor structures 100 each having two nanowires 118 (four nanowires total). The nanowire body portions 118a had undergone post-release processing to shape the nanowire body portions 118a. In that example, the nanowire end portions 118b had an average perimeter length of 40.9±2.1 nm. After post-release processing, the nanowire body portions 118a had an average perimeter length (i.e., circumference) of 35.4±0.5 nm. In addition to reducing the perimeter length of the nanowire 118 cross section, this example illustrates the improved consistency of geometry in the nanowire body portions as evidenced by reducing the standard deviation in perimeter length from 2.1 to 0.5 nm. In some embodiments, the post-release processing results in a transistor structure where the nanowire bodies 118a have cross-sectional perimeter lengths with a standard deviation of not more than 1.0 nm, including not more than 0.7 nm, and not more than 0.5 nm. In other embodiments, the post-release processing results in a plurality of transistor structures having nanowire bodies with cross-sectional perimeter lengths with a standard deviation of not more than 1.0 nm, including not more than 0.7 nm, and not more than 0.5 nm.

Various measurements of the nanowire body portion 118a and nanowire end portion 118b can be compared to identify a difference in the cross-sectional geometry. For example, a vertical height, a horizontal width, a perimeter length, or a difference in diameter or radius of inscribed and circumscribed circles can be used. For such values, a difference, a ratio, a standard deviation, or other relationship can be evaluated. For example, a ratio of the vertical heights of the nanowire body portion 118a and nanowire end portion 118b is no greater than 0.9, including no greater than 0.8, 0.7, or other value.

In another example, a ratio of the horizontal width of the nanowire body portion 118a and nanowire end portion 118b is no greater than 0.9, including no greater than 0.8, 0.7, or other value. In another example, the difference in diameters between a maximum inscribed circle and minimum circumscribed circle is determined for the nanowire body portion 118a and for the nanowire end portion 118b. The difference in diameter can be determined for the cross-sectional shape as a whole, or for an end portion of the cross-sectional shape (e.g., where the maximum inscribed circle contacts a side of the cross-sectional shape, such as shown in FIG. 2C). After determining the differences between diameters, these differences can be compared. Using the nanowire example of FIG. 2C, the nanowire end portion 118b has a vertical height of 10 nm, a maximum inscribed circle with a diameter of 10 nm, and a minimum circumscribed circle with a diameter of 14.36 nm; the nanowire body portion 118a has a vertical height of 8.76 nm, a maximum inscribed circle with a diameter of 8.34 nm, and a minimum circumscribed circle with a diameter of 9.57 nm. The difference in diameters for the nanowire end portion 118b is 4.36 nm and the difference in diameters for the nanowire body portion 118a is 1.23 nm. Comparing these differences in diameters gives an indication of the roundness of the cross-sectional geometry. In this example, the difference in diameters for the nanowire body portion 118a is 28% of that for the nanowire end portion 118b, indicating a more rounded shape. The difference in diameters can be compared, for example, to the vertical height, horizontal width, perimeter length, area, or other value of the cross-sectional shape. In one embodiment, the difference in diameters of the maximum inscribed circle and minimum circumscribed circle for the nanowire body portion 118a is no more than 75% of that for the nanowire end portion 118b, including no more than 60%, no more than 50%, no more than 40%, no more than 30%, and no more than 20%. Numerous comparisons can be made, as will be appreciated.

Referring now to FIGS. 3A-3C, cross-sectional views show an example transistor structure 100 with two nanowires 118 in various stages of processing, in accordance with an embodiment of the present disclosure. In this example, the cross section is taken through a portion of the structure corresponding to the nanowire body portion 118a. For clarity of illustration, not all structures of the transistor structure 100 are shown. Although this example illustrates shaping of nanowires 118 in a transistor structure 100, other structures can be shaped using similar processing techniques, as will be appreciated.

FIG. 3A shows a fin 108 that includes a subfin 112 and layer stack 109 of alternating material layers on top of the subfin 112. The layer stack 109 includes layers of a sacrificial material 120 (e.g., SiGe) and a channel material for nanowires 118 (e.g., Si). The fin 108 of FIG. 3A can result from an anisotropic etch through blanket layers of sacrificial material 120 and channel material of the nanowires 118 to define the fin 108. The sidewalls of the fin 108 may taper slightly and the top sacrificial layer 120 can have a rounded profile due to the etch process, as will be appreciated. A layer of sacrificial material 120 is above and below each nanowire 118. A layer of isolation material (e.g., shallow trench isolation or "STI") contacts the sides of the subfin 112 to define the substrate 110 and function as an etch stop.

FIG. 3B illustrates the transistor structure 100 of FIG. 3A after an isotropic etch process to remove the sacrificial material 120 and release the nanowires 118. For example, an isotropic etch selective to remove the sacrificial material 120 is used with minimal or no effect on the material of the nanowires 118. In this stage of processing, the nanowires 118 retain the generally rectangular or trapezoidal shape as in the layer stack 109 of FIG. 3A, but now may have slightly rounded corners.

FIG. 3C illustrates the transistor structure 100 of FIG. 3A after post-release processing to shape the nanowires 118. In this example, the nanowires 118 have a more rounded cross-sectional shape and a smaller size (including width, height, perimeter length, and circumference) compared to the nanowires 118 of FIG. 3B.

Turning now to FIG. 4, a flowchart illustrates processes in a method 400 of cleaning and shaping a semiconductor device structure, in accordance with an embodiment of the present disclosure. In accordance with some embodiments, the method 400 is used to clean and/or shape nanowires in a nanowire transistor. The techniques for forming and shaping nanowires of one or more transistors may include blanket deposition techniques, replacement fin techniques, and/or any other suitable techniques as will be apparent in light of this disclosure.

In one embodiment, method 400 begins with providing 405 a semiconductor structure to be processed. In one embodiment, the semiconductor structure is a nanowire transistor structure with a body portion of nanowires exposed for post-release processing. For example, the transistor structure is a fin of semiconductor material with a nanowire channel region connected to and extending between a source region and a drain region on opposite sides of a channel region. The channel region includes one or more nanowires extending between the source region and the drain region. Each nanowire includes an exposed nanowire body portion between nanowire end portions connected to the respective source and drain regions. Gate spacers are formed on the nanowire end portions and in contact with the source and drain regions. The gate spacers are configured to protect the source and drain regions during post-release processing. In some embodiments, providing 405 the semiconductor structure includes one or more processes to arrive at the nanowire transistor structure. In one such embodiment, a nanowire transistor structure is processed from a base or substrate. An example of such processing is discussed below in processes 406-416.

Figure 5:
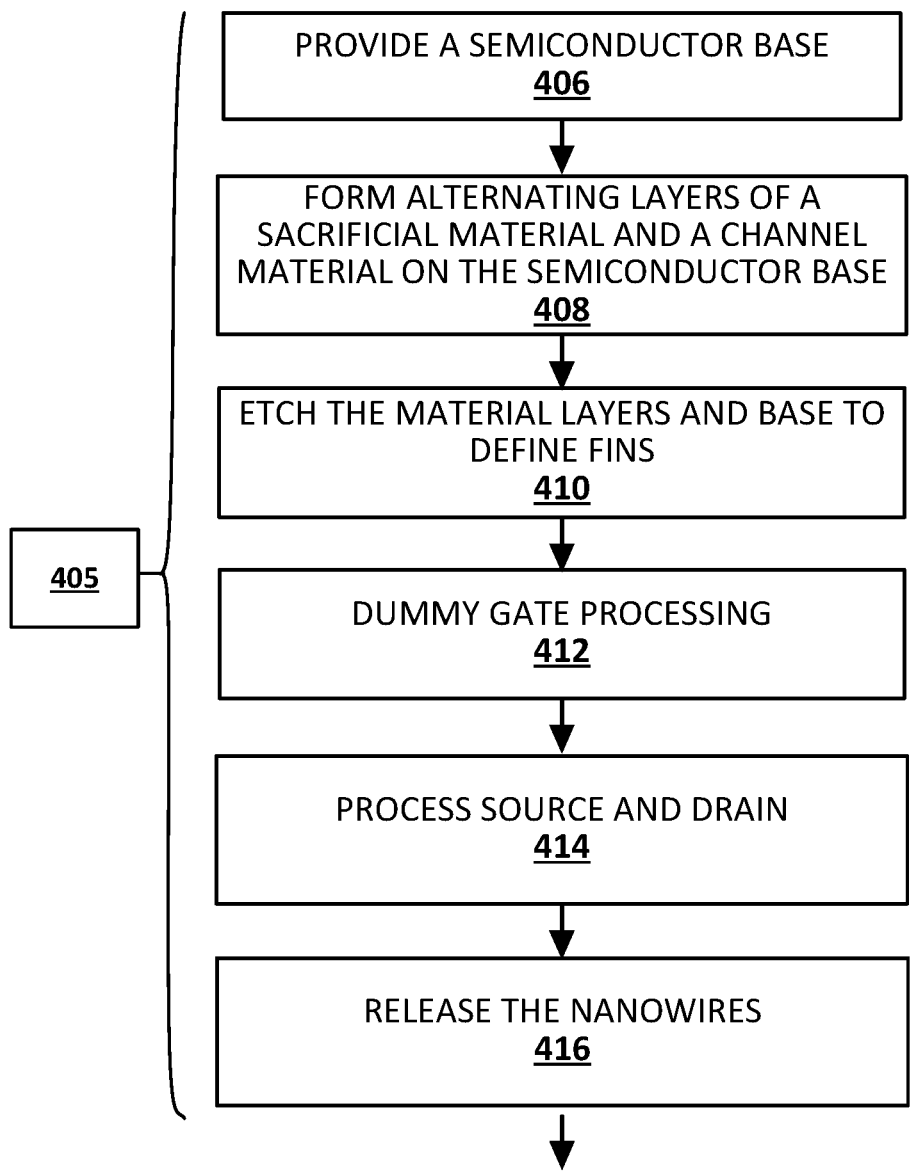
FIG. 5 is a flow chart showing processes in an example process of the method of FIG. 4, in accordance with an embodiment of the present disclosure

FIG. 5 illustrates processes included in one example process flow for providing 405 the nanowire transistor structure as discussed above. Although processes in this example are described in the context of forming a nanowire FinFET transistor, other nanowire structures can be used, including planar nanowire transistor configurations, vertical nanowire structures, and the like.

In one embodiment, process 405 begins with providing 406 a semiconductor base. The base may include any suitable material, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples. In some embodiments, the base is bulk silicon, such as monocrystalline silicon. In other embodiments, the base can be any suitable semiconductor material, including silicon, silicon carbide (SiC), gallium nitride (GaN), and gallium arsenide (GaAs) to name a few examples. The base can be selected in some embodiments from III-V materials and group IV materials. Further, the base can comprise a semiconductor layer deposited or grown on a substrate, such as silicon carbide layer epitaxially grown on a sapphire substrate. In still other embodiments, the base can be bulk semiconductor material, such as a wafer sliced from a boule or other bulk semiconductor material.

The base in some embodiments may include a Si on insulator (SOI) structure where an insulator/dielectric material (e.g., an oxide material, such as silicon dioxide) is sandwiched between two Si layers (e.g., in a buried oxide (BOX) structure), or any other suitable starting substrate where the top layer includes Si. In some embodiments, the base may be doped with any suitable n-type and/or p-type dopant at a dopant concentration in the range of 1E16 to 1E22 atoms per cubic cm, for example. For instance, a silicon base can be p-type doped using a suitable acceptor (e.g., boron) or n-type doped using a suitable donor (e.g., phosphorous, arsenic) with a doping concentration of at least 1E16 atoms per cubic cm. However, in some embodiments, the base may be undoped/intrinsic or relatively minimally doped (such as including a dopant concentration of less than 1E16 atoms per cubic cm), for example. In some embodiments, the base is a silicon substrate consisting essentially of Si. In other embodiments, the base may primarily include Si but may also include other material (e.g., a dopant at a given concentration). Also, note that the base material may include relatively high quality or device-quality monocrystalline Si or other material that provides a suitable template or seeding surface from which other monocrystalline semiconductor material features and layers can be formed. Therefore, unless otherwise explicitly stated, a base as described herein is not intended to be limited to a base that only includes Si.

In some embodiments, the base may have a crystalline orientation described by a Miller index of (100), (110), or (111), or its equivalents, as will be apparent in light of this disclosure. Although the base in this example embodiment is shown for ease of illustration as having a thickness (dimension in the Y-axis direction) similar to that of other layers in the figures, the base may be relatively much thicker than the other layers, such as having a thickness in the range of 1 to 950 microns (or in the sub-range of 20 to 800 microns), for example, or any other suitable thickness or range of thicknesses as will be apparent in light of this disclosure. In some embodiments, the base may include a multilayer structure including two or more distinct layers that may or may not be compositionally different. In some embodiments, the base may include grading (e.g., increasing and/or decreasing) of one or more material concentrations throughout at least a portion of the material. In some embodiments, the base may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Process 405 continues with forming 408 alternating layers of sacrificial material and channel material on the base, in accordance with some embodiments. In one embodiment, the sacrificial layer is formed directly on the base, followed by the channel material, and followed by additional layer pairs of sacrificial material and channel material, and finally followed by a top layer of sacrificial material. For example, the first (bottom) layer on the base is the sacrificial material and the last (top) layer is also the sacrificial material, thereby providing layers of the channel material between layers of the sacrificial material. In one example embodiment, the base is bulk silicon (Si), the sacrificial material is silicon germanium (SiGe), and the channel material is silicon doped with a suitable dopant and concentration. In another example, the base is graphene, the sacrificial material is gallium, and the channel material is gallium arsenide (GaAs). Other material combinations can also be used, as will be appreciated.

Each layer of sacrificial material or channel material can be formed using any suitable processing, such as one or more deposition or epitaxial growth processes, as will be apparent in light of this disclosure. In one embodiment, alternating layers of sacrificial material and channel material can be formed using layer-by-layer epitaxial growth, where the sacrificial material can subsequently be removed to release nanowires of the channel material. For instance, in an example embodiment, a given channel layer may include alternating layers of group IV and group III-V semiconductor material, where either the group IV or group III-V material is sacrificial, to enable the formation of one or more nanowires. In some embodiments, a given layer of channel material may include a vertical channel height (dimension in the Y-axis direction) in the range of 5 nm to 50 nm (or in a subrange of 5-45, 5-40, 5-35, 5-30, 5-25, 5-20, 5-15, 5-10, 10-40, 10-30, 10-20, 15-40, 15-30, 15-20, 20-40, 20-30 and 30-40 nm) and/or a maximum vertical thickness of at most 50, 40, 30, 25, 20, 15, or 10 nm, for example. Other suitable materials and channel height requirements or thresholds will be apparent in light of this disclosure.

In some embodiments, multiple different channel materials may be formed on different areas of the substrate, such as for CMOS applications, for example. For instance, a first channel material may be formed on a first area of the substrate to be used for one or more p-channel transistor devices (e.g., one or more PMOS devices) and a second channel material may be formed on a second area of the substrate 200 to be used for one or more n-channel transistor devices (e.g., one or more NMOS devices). By selecting the subfin material to have the desired properties, multiple different channel materials can be grown. For instance, in some such embodiments, the first channel material may include a n-type group III-V or group IV material and a second channel material may include a p-type group III-V or group IV material.

In some embodiments employing multiple different channel materials, the first channel material may include group IV semiconductor material (e.g., Si, SiGe, Ge, etc.) and the second channel material may include group III-V semiconductor material (e.g., GaAs, InGaAs, InP, etc.). In general, a given channel material may include monocrystalline group IV semiconductor material and/or group III-V semiconductor material. For instance, in a beaded-fin transistor configuration, the channel region may include both group IV semiconductor material (e.g., for the broader or narrower portions) and group III-V semiconductor material (e.g., for the other of the broader or narrower portions). Note that the multiple different channel materials may be formed using any suitable techniques, such as masking, depositing, and removing the masking as desired to form any number of compositionally different channel materials. Numerous different channel material configurations and variations will be apparent in light of this disclosure.

Process 405 continues with defining 410 fins, in accordance with one embodiment. For example, each fin has a subfin portion of base material and an upper fin portion of alternating layers of sacrificial material and channel material. In embodiments where blanket layers of material are formed on the base in process 408, for example, regions to be processed 410 into fins are masked, followed by etching the surrounding regions to define one or more fins. For instance, the an anisotropic etch proceeds substantially vertically through the upper fin portion to define isolation trenches between adjacent fins. In some embodiments, the etch process proceeds into the base to define a fin that includes a subfin portion of the base material and an upper fin portion of alternating layers of sacrificial material and channel material. In some embodiments, the etch process defines groups of parallel fins extending vertically up from the base. In other embodiments, the etch defines planar or 3D transistor structures having an H shape, where the channel region corresponds to the beam extending between the source and drain regions represented by the vertical bars of the H.

In other embodiments, for example, the alternating layers of sacrificial material and channel material are formed on the base by growth or deposition in a trench. For example, the trench is an aspect ratio trapping trench ("ART" trench) defined in a layer of insulating material, such as silicon dioxide ($SiO_2$) formed by thermal oxidation or by deposition using a suitable one of the aforementioned techniques. The insulating material is then patterned and etched to define trenches that extend to a substrate or other material layer. A base material can be formed directly on the substrate in the lower portion of the trench, followed by alternating layers of the sacrificial material and channel material. The insulating material can be recessed to expose all or part of the fin. In some embodiments, the insulating material is recessed to the top of the subfin (i.e., base material) to expose only the layer stack of sacrificial material and channel material in the upper portion of the fin. In other embodiments, the insulating material is recessed completely to expose the entire subfin, or recessed to a level below the first layer of sacrificial material to expose a portion of the subfin. Numerous variations and embodiments will be apparent in light of the present disclosure.

In yet other embodiments, defining 410 fins may be performed using a replacement fin-based approach. In one embodiment, the replacement fin-based approach includes forming fins in the base, such as by patterning and etching bulk semiconductor material. Shallow trench isolation (STI) material is the formed around those fins, followed by recessing the native-to-substrate fins to define fin-shaped trenches in the STI material. Subfin material and alternating layers of sacrificial material and channel material can then be formed in the fin-shaped trenches. In one embodiment, the replacement fin approach continues with removing the STI material and forming an insulating material on the base between the subfins, leaving the layer stack of alternating sacrificial material and channel material exposed.

In some embodiments, the subfin is a Group IV semiconductor material, such as single-crystal silicon or germanium. In other embodiments, the subfin material is a Group III-V semiconductor material, such as GaAs, InGaAs, AlGaAs, or AlAs, to name a few examples. In some embodiments, the subfin material may or may not be doped with a suitable dopant (e.g., boron, phosphorous, and/or arsenic). In embodiments where the subfin material is doped, it may be n-type doped (e.g., with phosphorous or arsenic) or p-type doped (e.g., with boron) at a dopant concentration in the range of 1E16 to 1E22 atoms per cubic cm, for example. In some embodiments, the subfins may have a multilayer structure including two or more distinct layers (that may or may not be compositionally different). In some embodiments, the subfins may include grading (e.g., increasing and/or decreasing) of one or more material concentrations throughout at least a portion of the subfin material.

In some embodiments, each fin may include a vertical fin height (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical fin height of at most 500, 450, 400, 350, 300, 250, 200, 150, 100, or 50 nm, for example. In some embodiments, each fin may include a horizontal fin width (dimension in the X-axis direction) in the range of 2-50 nm (or in a subrange of 2-5, 2-10, 5-10, 5-20, 5-30, 5-50, 10-20, 10-30, 10-50, 20-30, 20-50, or 30-50 nm) and/or a maximum horizontal fin width of at most 50, 30, 20, 10, or 5 nm, for example. In some embodiments, the ratio of fin height to fin width may be greater than 1, such as greater than 1.5, 2, 2.5, 3, 3.5, 4, 4.5, 5, 6, 7, 8, 9, 10, 15, 20, or greater than any other suitable threshold ratio, as will be apparent in light of this disclosure. Other suitable materials and thickness values/ranges/thresholds will be apparent in light of this disclosure.

In some embodiments, the base or subfin material may be oppositely type doped relative to the overlying upper fin material (e.g., of the source and drain regions) to provide a tunnel diode configuration to help reduce or eliminate parasitic leakage (e.g., subthreshold leakage). For instance, in some embodiments, the subfin material may be intentionally p-type doped (e.g., with a doping concentration of at least 1E16, 5E16, 1E17, 5E17, 1E18, 5E18, or 1E19 atoms per cubic cm) if the overlying material is to be n-type doped, or vice versa.

Method 400 continues with forming 412 a dummy gate structure on the channel region of the fins. In one embodiment, the process may include deposition of a dummy gate oxide, deposition of a dummy gate electrode (e.g., poly-Si), and optionally, deposition and patterning of a hardmask. Gate spacers are formed along opposite sides of the dummy gate electrode. For example, the gate spacers comprise silicon nitride ($Si_3N_4$) or other suitable material, as will be appreciated.

Process 405 continues with processing 414 the source/drain regions using any suitable techniques, in accordance with an embodiment of the present disclosure. For example, processing 414 the source and drain regions can be performed by etching at least a portion of the exposed source and drain portion of the fins to remove the layer stack, and forming replacement source and drain material using any suitable techniques, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. In some embodiments, the exposed source/drain regions of the fins need not be completely removed; instead, the material in the layer stack at the source/drain regions is converted to final source/drain regions by doping, implantation, and/or cladding with a source/drain material or other suitable processing, for example.

In some embodiments, the source and drain regions may be formed one polarity at a time, such as performing processing for one of n-type and p-type regions, and then performing processing for the other of the n-type and p-type regions. In some embodiments, the source and drain regions may include any suitable doping scheme, such as including suitable n-type and/or p-type dopant (e.g., in a concentration in the range of 1E16 to 1E22 atoms per cubic cm). However, in some embodiments, at least one source or drain region may be undoped/intrinsic or relatively minimally doped, such as including a dopant concentration of less than 1E16 atoms per cubic cm, for example.

Process 405 continues with releasing 416 nanowires in the channel region. Process 416 may begin with removing the dummy gate electrode between the gate spacers to expose the channel region of the fin. For example, a polycrystalline silicon dummy gate electrode can be removed using a wet etch process (e.g., nitric acid/hydrofluoric acid), an anisotropic dry etch, or other suitable etch process, as will be appreciated. At this stage of processing, the layer stack of alternating layers of channel material and sacrificial material is exposed in the channel region. The channel region extends between and contacts the source and drain regions, where ends of the layer stack in the are protected by the gate spacers. The sacrificial material in the layer stack can then be removed by etch processing, in accordance with some embodiments.

Etching the sacrificial material may be performed using any suitable wet or dry etching process such that the etch process selectively removes the sacrificial material and leaves intact the channel material. In one embodiment, the sacrificial material is silicon germanium (SiGe) and the channel material is electronic grade silicon (Si). For example, a gas-phase etch using an oxidizer and hydrofluoric acid (HF) has shown to selectively etch SiGe in SiGe/Si layer stacks. In another embodiment, a gas-phase chlorine trifluoride (ClF3) etch is used to remove the sacrificial SiGe material. The etch chemistry can be selected based on the germanium concentration, nanowire dimensions, and other factors, as will be appreciated. After removing the SiGe sacrificial material, the resulting channel region includes silicon nanowires extending between the source and drain regions of the fin, where ends of the nanowires (e.g., silicon) contact the source and drain structures and remain at least partially protected by the gate spacers. In some embodiments, the nanowires have a rectangular cross-sectional shape at this stage of processing. For example, the cross-sectional shape is square, rectangular (e.g., a nanoribbon), or trapezoidal.

After providing 405 the semiconductor structure to be processed, such as the nanowire transistor structure ready for post-release processing, method 400 continues with one or more cycles of forming 420 a thin-film or surface layer on the semiconductor structure, followed by removing 425 the surface layer. Processes 420 and 425 may be referred to collectively as cleaning 422 the semiconductor structure since the cycle is effective to remove residual materials from the surface of the semiconductor structure, in accordance with some embodiments. When the semiconductor structure is the nanowire body portion of a nanowire transistor structure, for example, cleaning 422 the nanowire body portion is useful to remove trace impurities in addition to shaping and smoothing the nanowire. One or more cleaning 422 cycles can be performed, including two, three, four, five, or more cleaning cycles. In some embodiments, three cleaning 422 cycles are sufficient to remove trace SiGe from silicon that is left behind from the silicon nanowire release etch. Cleaning 422 has shown to improve the surface properties as well as to improve the geometric consistency of silicon nanowires.

In one embodiment, the surface layer has a thickness no greater than 5 Å, no greater than 10 Å, no greater than 20 Å, or no greater than 50 Å. For example, the surface layer is an oxide formed on silicon with a suitable oxidation process. In another example, the surface layer is an oxide formed on gallium. In yet another example, the surface layer is a nitride formed on silicon or gallium, for example. In general, cleaning 422 the semiconductor structure can be performed with Group IV or Group III/V semiconductor materials. Any material of the semiconductor structure and any surface layer composition is acceptable provided that the surface layer can be readily removed using a suitable etch process.

The surface layer is generally formed in part with molecules of the semiconductor structure, such as the first few molecular layers of a substrate or nanowire body portion. For example, silicon nanowires form a silicon dioxide surface layer that consumes one or more atomic layers of silicon. Removing 425 the surface layer (e.g., $SiO_2$) removes one or more atomic layer of the semiconductor material (e.g., Si of a nanowire). Thus, impurities or residual materials embedded in or attached to the surface of the nanowire can be removed. In addition, since oxidation is generally an isotropic process, corners, points, protrusions, and similar features on the semiconductor structure tend to be rounded or smoothed. As such, cleaning 422 the semiconductor structure has shown to be effective to yield nanowires with a rounded profile, a reduced perimeter length/circumference, and/or a smoother surface compared to nanowires that are not subjected to the cleaning 422 process.

Forming 420 the oxide surface layer can be performed using one of a variety of suitable methodologies. For example, an in-situ oxidation is performed by spinning onto a wafer an aqueous ozone (03) solution, a hydrogen peroxide solution, or other liquid oxidizing agent. On silicon, for example, the oxidation process forms 420 a silicon oxide thin film with a thickness of about 3-4 Å. The silicon oxide can be removed 425 with hydrofluoric acid (HF), which is a self-terminating etch process on silicon. In other words, the HF etch removes the layer of $SiO_x$ without further effect on the underlying silicon. Other procedures can be used to remove the oxide or other surface layer, such a wet etch using sulfuric acid or nitric acid. In some embodiments, the etch-back includes taking precautions to prevent the acid (e.g., $HNO_3$) from attacking the silicon of the nanowire body portion. An example of one such precaution is exposing the oxidized nanowire to the etch chemistry for no more time than necessary to remove the oxide layer, as will be appreciated.

In another embodiment, forming 420 the surface layer is performed using an ex-situ oxidation process. For example, forming 420 an oxide surface layer is performed by depositing a thin-film oxide layer using a UV-activated ozone plasma or other gas-phase oxidation process. In some embodiments, the resulting thin-film oxide is annealed to diffuse the oxygen into the silicon material. A possible advantage of such gas-phase processing is that oxidation may be successful with consistent rates along all exposed faces of a structure. For example, ozone plasma can oxidize faces located in a narrow gap that may be inaccessible to an aqueous solution due to being overly viscous. Another possible advantage of gas-phase oxidation is that such a process has shown to be more effective in removing germanium bound to nitride molecules. Yet another possible advantage of gas-phase oxidation is that it can be more controllable than wet chemistry in some cases. For example, the oxidation rate can be tuned by adjusting the concentration of ozone in the plasma. In some such embodiments, forming 420 the surface layer (e.g., oxide) is a tunable process, where the concentration of ozone is selected to provide the desired oxidation rate or thickness of oxide surface layer on the semiconductor structure.

In another embodiment, forming 420 the surface layer is performed by forming a silicon nitride ($Si_3N_4$) surface layer on a silicon nanowire. For example, silicon is exposed to a nitrogen environment at a temperature from 1300-1400° C. to form a surface layer of $Si_3N_4$ or a compositional variant (e.g., $Si_xN_y$). A surface layer of $Si_3N_4$ can also be formed by gas-phase deposition. Other suitable processes or combinations of processes can be used to form the nitride surface layer, including CVD deposition or other suitable process. The silicon nitride surface layer can be removed 425 using a wet chemical etch (e.g., exposure to hydrofluoric acid or hot sulfuric acid), or a selective gas-phase etch (e.g., involving a fluorine source).

After forming 420 the surface layer, the surface layer (e.g., oxide) is subsequently removed 425 using an etchback process. In one embodiment, each cycle of oxidation and etch back removes approximately 3-4 Å of material from a nanowire body portion of silicon. Removing 425 the surface layer can be performed using any suitable wet or dry etch processes. In embodiments where the surface layer is silicon dioxide, for example, liquid hydrofluoric acid (HF) or anhydrous HF effectively removes the oxide layer. In embodiments where the surface layer is gallium (iii) oxide ($Ga_2O_3$), for example, a wet or dry HF etch, a chlorine-based dry etch, or a wet hydrochloric acid etch can be used. Other wet or dry etch processes are acceptable, depending on the material of the semiconductor structure (e.g., silicon, gallium, silicon carbide) and the composition of the surface layer (e.g., oxide, nitride, etc.)

Experiments have shown that each cleaning 422 cycle can be effective to remove trace or residual amounts of SiGe from Si. The cleaning 422 cycle is particularly useful to remove trace SiGe present on Si in an amount that is substantially unaffected (i.e., cannot be removed or is difficult to remove) during the SiGe release etch processes (e.g., $ClF_3$). It is desirable to remove the trace SiGe since the SiGe can result in charge accumulation, leakage, and/or surface degradation that reduces performance of the nanowire transistor. Cleaning 422 a Si nanowire or other silicon structure as discussed above has been found to be effective to remove residual SiGe to a level below that which can be detected using TEM technology (i.e., below 0.5 Å). Experiments have also shown that three cycles of cleaning 422 is effective to remove residual SiGe below detection limits of TEM. Experiments have further shown that 40-70 seconds of gas-phase $ClF_3$ plasma etch to remove sacrificial SiGe, plus three cycles of cleaning 422 can effectively remove SiGe from a silicon substrate to levels below detectability with TEM. In addition to cleaning 422 nanowires, forming 420 a surface layer and removing 425 the surface layer can be used to clean and/or shape other semiconductor structures.

Optionally, method 400 includes annealing 426 the nanowire(s) to cause the silicon (or other material) to reflow, thereby rounding corners and/or smoothing protrusions on the surface of the nanowire. For example, a high-temperature annealing process, sometimes referred to as rapid thermal anneal (RTA) can be used. Such processing has a temperature and length of time sufficient to cause reflow of the silicon (or other) material.

After cleaning 422 the nanowires or other semiconductor structure, method 400 continues with completing 428 the transistor. In one embodiment, completing 428 the transistor may begin with processing 430 the final gate stack, in accordance with some embodiments. In this example embodiment, the gate stack is formed using a gate-last fabrication flow, which may be considered a replacement gate or replacement metal gate (RMG) process. In embodiments utilizing a nanowire channel structure, the gate stack may substantially (or completely) surround each nanowire body portion, such as wrapping around at least 80, 85, 90, 95% or more of each nanowire body. Processing 430 the final gate stack includes depositing a gate dielectric on the exposed nanowire bodies in the channel region, followed by formation of a gate electrode in contact with the gate dielectric. Any suitable technique can be used, including spin-coating or CVD deposition, for example. The gate dielectric may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric can be annealed to improve its quality when high-k dielectric material is used. The gate electrode may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric and/or gate electrode may include a multilayer structure of two or more material layers, for example. For instance, in some embodiments, a multilayer gate dielectric may be employed to provide a more gradual electric transition from the channel region to the gate electrode, for example. In some embodiments, the gate dielectric and/or gate electrode may include grading (e.g., increasing and/or decreasing) the content or concentration of one or more materials in at least a portion of the feature(s). In some embodiments, one or more additional layers may also be present in the final gate stack, such as one or more relatively high or low work function layers and/or other suitable layers. Note that the gate dielectric may also be used to form replacement gate spacers on one or both sides of the nanowire body, such that the gate dielectric is between the gate electrode and one or both gate spacers, for example. Numerous different gate stack configurations will be apparent in light of this disclosure.

Method 400 continues with forming 435 source/drain contacts. In some embodiments, the source and drain contacts can be formed 435 using any suitable techniques, such as forming contact trenches in an ILD layer over the respective source/drain regions and then depositing metal or metal alloy (or other suitable electrically conductive material) in the trenches. In some embodiments, forming 435 source/drain contacts may include silicidation, germanidation, III-V-idation, and/or annealing processes, for example. In some embodiments, the source and drain contacts may include aluminum or tungsten, although any suitable conductive metal or alloy can be used, such as silver, nickel-platinum, or nickel-aluminum, for example. In some embodiments, one or more of the source and drain contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance reducing layer may be present between a given source or drain region and its corresponding source or drain contact, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding source or drain region, for example.

Method 400 continues with completing 440 a general integrated circuit (IC) as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure. Note that the processes in method 400 are shown in a particular order for ease of description. However, one or more of the processes may be performed in a different order or may not be performed at all (and thus be optional), in accordance with some embodiments. For example, some or all of processes 406-416 may be optional in some embodiments. Numerous variations on method 400 and the techniques described herein will be apparent in light of this disclosure.

Example System

Figure 6:
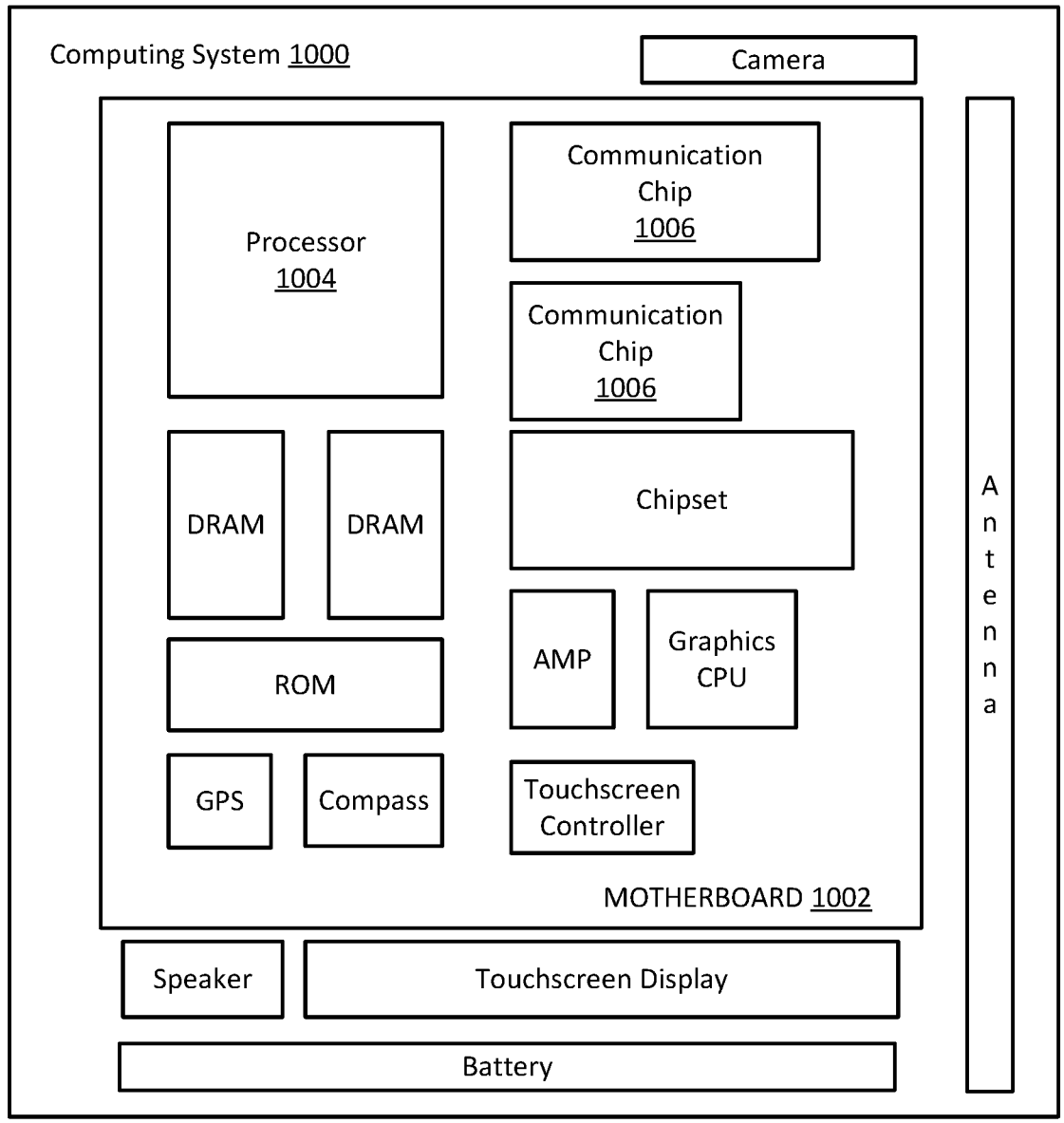
FIG. 6 illustrates an example computing system implemented with integrated circuit structures and/or transistor devices formed in accordance with some embodiments of the present disclosure.

FIG. 6 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is a semiconductor structure comprising a body comprising a semiconductor material; a gate structure wrapped around the body, the gate structure including a gate electrode and a gate dielectric between the body and the gate electrode; and a source region and a drain region, the body being between the source and drain regions; wherein the body has a first cross-sectional shape under the gate dielectric, and a second cross-sectional shape elsewhere, the first cross-sectional shape having corners that are more rounded than the second cross-sectional shape.

Example 2 includes the subject matter of Example 1, the gate structure further comprising a first gate spacer in contact with the second cross-sectional shape and a second gate spacer in contact with the second cross-sectional shape.

Example 3 includes the subject matter of Examples 1 or 2, wherein the first cross-sectional shape is round or oval, and the second cross-sectional shape is more square, rectangular, or trapezoidal.

Example 4 includes the subject matter of any of Examples 1-3, wherein the body comprises a nanowire that has an external size defined by a minimum circumscribed circle and an internal size defined by a maximum inscribed circle, wherein the difference between the external size and the internal size is greater for the second cross-sectional shape than for the first cross-sectional shape.

Example 5 includes the subject matter of any of Examples 1-4, wherein the source and drain regions are compositionally different from the body.

Example 6 includes the subject matter of any of Examples 1-5, wherein the first cross-sectional shape has a first vertical height, the second cross-sectional shape has a second vertical height, and a ratio of the first vertical height to the second vertical height is no greater than 0.9.

Example 7 includes the subject matter of any of Examples 1-5, wherein the first cross-sectional shape has a first perimeter length, the second cross-sectional shape has a second perimeter length, and a ratio of the first perimeter length to the second perimeter length is no greater than 0.9.

Example 8 includes the subject matter of any of Examples 1-7, wherein the first cross-sectional shape is selected from a circle, an oval, or a rectangle with rounded corners and wherein the second cross-sectional shape is selected from a rectangle, a square, or a trapezoid, the rectangle, the square, or the trapezoid having corners that are less rounded than the corners of the first cross-sectional shape.

Example 9 includes the subject matter of any of Examples 1-8, wherein the body is a first body, the structure further including one or more additional bodies, each of the first and additional bodies being a nanowire or nanoribbon, each body having the first cross-sectional shape under the gate dielectric, wherein a perimeter length of the first cross-sectional shape differs by no more than 1.0 nm between the first body and any of the additional bodies.

Example 10 includes the subject matter of Example 9, wherein a perimeter length of the first cross-sectional shape is less than 40 nm.

Example 11 includes the subject matter of Example 10, wherein the perimeter length of the first cross-sectional shape is less than 30 nm.

Example 12 includes the subject matter of Example 9, wherein an average perimeter length of the first cross-sectional shape of the first and additional bodies has a standard deviation no greater than 1.0 nm.

Example 13 includes the subject matter of Example 12, wherein the standard deviation is no greater than 0.5 nm.

Example 14 includes the subject matter of any of Examples 1-13, wherein the portion of the body having the second cross-sectional shape has a surface roughness that is greater than a surface roughness of the portion of the body having the first cross-sectional shape.

Example 15 includes the subject matter of any of Examples 1-14, wherein the portion of the body having the first cross-sectional area consists essentially of silicon and the portion of the body having the second cross-sectional area comprises silicon and germanium.

Example 16 includes the subject matter of Example 15, wherein the portion of the body having the first cross-sectional area is free of germanium.

Example 17 includes the subject matter of any of Examples 1-14, wherein the portion of the body having the first cross-sectional area consists essentially of gallium and the portion of the body having the second cross-sectional area comprises gallium and arsenic.

Example 18 includes the subject matter of Example 17, wherein the portion of the body having the first cross-sectional area is free of arsenic.

Example 19 includes the subject matter of any of Examples 1-18, wherein the body is part of a vertical stack including at least three nanowires.

Example 20 is a nanowire device comprising a nanowire comprising a semiconductor material and having a first end portion, a second end portion, and a body between the first end portion and the second end portion; a first conductive structure in contact with the first end portion; a second conductive structure in contact with the second end portion; and a gate structure around the body portion, the gate structure including a conductive electrode and a dielectric between the conductive electrode and the body portion; wherein the body portion has a first cross-sectional shape and the first end portion has a second cross-sectional shape different from the first cross-sectional shape.

Example 21 includes the subject matter of Example 20, wherein the first cross-sectional shape is more rounded and has a smaller perimeter length compared to the second cross-sectional shape.

Example 22 includes the subject matter of Example 20, wherein at least one of the first conductive structure and the second conductive structure comprises a semiconductor material and a metal.

Example 23 includes the subject matter of Example 21, wherein at least one of the first conductive structure and the second conductive structure comprises a metal.

Example 24 includes the subject matter of any of Examples 20-22, wherein the semiconductor material of the nanowire comprises silicon.

Example 25 includes the subject matter of any of Examples 20-24, the gate structure further comprising: a first gate spacer around the first end portion and the second end portion.

Example 26 includes the subject matter of any of Examples 20-25, wherein the first cross-sectional shape is round or oval, and the second cross-sectional shape is more square, rectangular, or trapezoidal.

Example 27 includes the subject matter of any of Examples 20-26, wherein the nanowire has an external size defined by a minimum circumscribed circle and an internal size defined by a maximum inscribed circle, wherein the difference between the external size and the internal size is greater for the second cross-sectional shape than for the first cross-sectional shape.

Example 28 includes the subject matter of any of Examples 20-27, wherein the first conductive structure is a source and the second conductive structure is a drain.

Example 29 includes the subject matter of any of Examples 20-28, wherein the first cross-sectional shape has a first vertical height, the second cross-sectional shape has a second vertical height, and a ratio of the first vertical height to the second vertical height is no greater than 0.9.

Example 30 includes the subject matter of any of Examples 20-29, wherein the first cross-sectional shape has a first perimeter length, the second cross-sectional shape has a second perimeter length, and a ratio of the first perimeter length to the second perimeter length is no greater than 0.9.

Example 31 includes the subject matter of any of Examples 20-25, wherein the first cross-sectional shape is selected from a circle, an oval, or a rectangle with rounded corners and wherein the second cross-sectional shape is selected from a rectangle, a square, or a trapezoid, and the first cross-sectional shape is more rounded than the second cross-sectional shape.

Example 32 includes the subject matter of any of Examples 20-31, wherein the nanowire is a first nanowire, the structure further including a second nanowire, the second nanowire having the first cross-sectional shape under the gate dielectric, and wherein a perimeter length of the first body cross section differs from a perimeter length of the second body cross section by no more than 0.5 nm.

Example 33 includes the subject matter of any of Examples 20-32, wherein the perimeter length of the first cross-sectional shape is less than 40 nm.

Example 34 includes the subject matter of Example 33, wherein the perimeter length of the first cross-sectional shape is less than 30 nm.

Example 35 includes the subject matter of any of Examples 20-31, wherein the nanowire is a first nanowire, the structure further including one or more additional nanowires, each nanowire having the first cross-sectional shape under the gate dielectric, wherein an average circumference of the bodies of the first and additional nanowires has a standard deviation no greater than 1.0 nm.

Example 36 includes the subject matter of Example 35, wherein the standard deviation is no greater than 0.5 nm.

Example 37 includes the subject matter of any of Examples 20-36, wherein the first end portion and/or the second end portion has a surface roughness that is greater than a surface roughness of the body.

Example 38 includes the subject matter of any of Examples 20-36, wherein the body consists essentially of silicon and first end portion and/or the second end portion comprises silicon and germanium.

Example 39 includes the subject matter of Example 38, wherein the body is free of germanium.

Example 40 includes the subject matter of any of Examples 20-36, wherein the body consists essentially of gallium and the first and/or second end portions comprise gallium and arsenic.

Example 41 includes the subject matter of Example 40, wherein the portion of the body is free of arsenic.

Example 42 includes the subject matter of any of Examples 20-41, wherein the body is part of a vertical stack including at least three nanowires.

Example 43 includes the subject matter of any of Examples 20-41, wherein the nanowire device is a 3-D transistor.

Example 44 includes the subject matter of any of Examples 20-41, wherein the nanowire device is a gate-all-around transistor.

Example 45 includes the subject matter of any of Examples 20-41, wherein the nanowire device is an omega-FET.

Example 46 includes the subject matter of any of Examples 20-41, wherein the nanowire device is a planar transistor.

Example 47 is a nanowire transistor structure comprising a first region of semiconductor material; a second region of semiconductor material; one or more nanowires extending between a first end portion in contact with the first region and a second end portion in contact with the second region; and a gate structure around a body of the nanowire between the first end portion and the second end portion, the gate structure comprising a gate electrode and a dielectric between the gate electrode and the body; wherein the body of the nanowire has a first cross-sectional shape and the first end portion has a second cross-sectional shape, the first cross-sectional shape being more rounded and having a smaller circumference compared to the second cross-sectional shape.

Example 48 includes the subject matter of Example 47 further comprising a source contact on the first region of semiconductor material and a drain contact on the second region of semiconductor material.

Example 49 includes the subject matter of any of Examples 47 or 48, wherein the gate structure is a first gate structure, the nanowire transistor structure further comprises a second gate structure around the body and isolated from the first gate structure by a dielectric.

Example 50 includes the subject matter of any of Examples 47-49, wherein the one or more nanowires comprises a group IV semiconductor or a group III-V semiconductor.

Example 51 includes the subject matter of any of Examples 47-50, the gate structure further comprising a first gate spacer around the first end portion and the second end portion.

Example 52 includes the subject matter of any of Examples 47-51, wherein the first cross-sectional shape is round or oval, and the second cross-sectional shape is more square, rectangular, or trapezoidal.

Example 53 includes the subject matter of any of Examples 47-52, wherein the nanowire has an external size defined by a minimum circumscribed circle and an internal size defined by a maximum inscribed circle, wherein the difference between the external size and the internal size is greater for the second cross-sectional shape than for the first cross-sectional shape.

Example 54 includes the subject matter of any of Examples 47-53, wherein the first conductive structure is a source and the second conductive structure is a drain.

Example 55 includes the subject matter of any of Examples 47-54, wherein the first cross-sectional shape has a first vertical height, the second cross-sectional shape has a second vertical height, and a ratio of the first vertical height to the second vertical height is no greater than 0.9.

Example 56 includes the subject matter of any of Examples 47-55, wherein the first cross-sectional shape has a first perimeter length, the second cross-sectional shape has a second perimeter length, and a ratio of the first perimeter length to the second perimeter length is no greater than 0.9.

Example 57 includes the subject matter of any of Examples 47-56, wherein the first cross-sectional shape is selected from a circle, an oval, or a rectangle with rounded corners and wherein the second cross-sectional shape is selected from a rectangle, a square, or a trapezoid, the rectangle, the square, the first cross-sectional shape being more rounded than the second cross-sectional shape.

Example 58 includes the subject matter of any of Examples 47-57, wherein the nanowire is a first nanowire, the structure further including a second nanowire, the second nanowire having the first cross-sectional shape under the gate dielectric, and wherein a perimeter length of the first body cross section differs from a perimeter length of the second body cross section by no more than 0.5 nm.

Example 59 includes the subject matter of any of Examples 47-58, wherein the perimeter length of the first body cross section is less than 40 nm.

Example 60 includes the subject matter of Example 59, wherein the perimeter length of the first body cross section is less than 30 nm.

Example 61 includes the subject matter of any of Examples 47-60, wherein the nanowire is a first nanowire, the structure further including one or more additional nanowires, each nanowire having the first cross-sectional shape under the gate dielectric, wherein an average circumference of the bodies of the first and additional nanowires has a standard deviation no greater than 1.0 nm.

Example 62 includes the subject matter of Example 61, wherein the standard deviation is no greater than 0.5 nm.

Example 63 includes the subject matter of any of Examples 47-62, wherein the first end portion and/or the second end portion has a surface roughness that is greater than a surface roughness of the body.

Example 64 includes the subject matter of any of Examples 47-63, wherein the body consists essentially of silicon and first end portion and/or the second end portion comprises silicon and germanium.

Example 65 includes the subject matter of Example 64, wherein the body is free of germanium.

Example 66 includes the subject matter of any of Examples 47-63, wherein the body consists essentially of gallium and the first and/or second end portions comprise gallium and arsenic.

Example 67 includes the subject matter of Examples 66, wherein the portion of the body is free of arsenic.

Example 68 includes the subject matter of any of Examples 47-67, wherein the body is part of a vertical stack including at least three nanowires.

Example 69 is a method of shaping a nanowire structure, the method comprising providing a nanowire comprising a semiconductor material with a body between a first end portion and a second end portion; forming a surface layer on the body portion, the surface layer having a thickness no greater than 10 Å; removing the surface layer from the body; and repeating at least once forming the surface layer and removing the surface layer, thereby rounding the body compared to the first end portion and the second end portion.

Example 70 includes the subject matter of Examples 69, wherein the thickness is no greater than 5 Å.

Example 71 includes the subject matter of Examples 69 or 70, wherein the surface layer includes an atomic layer of the semiconductor material.

Example 72 includes the subject matter of any of Examples 69-71, wherein the nanowire consists essentially of silicon and the surface layer is a silicon oxide.

Example 73 includes the subject matter of any of Examples 69-71, wherein the nanowire comprises silicon and the surface layer is an oxide.

Example 74 includes the subject matter of any of Examples 69-73, wherein forming the surface layer includes an in-situ oxidation process.

Example 75 includes the subject matter of any of Examples 69-73, wherein forming the surface layer includes an ex-situ oxidation process.

Example 76 includes the subject matter of Example 75, wherein the ex-situ oxidation process includes depositing an oxide layer and annealing the oxide layer.

Example 77 includes the subject matter of any of Examples 69-76, wherein removing the surface layer includes a wet hydrofluoric acid etch.

Example 78 includes the subject matter of any of Examples 69-76, wherein removing the surface layer includes an anhydrous HF etch.

Example 79 includes the subject matter of any of Examples 69-78, wherein providing the nanowire includes providing a dielectric on the first end portion and the second end portion.

Example 80 includes the subject matter of any of Examples 69-79, wherein providing the nanowire further includes selecting the nanowire including a source structure in contact with the first end portion, and a drain structure in contact with the second end portion.

Example 81 includes the subject matter of any of Examples 69-80 further comprising annealing the nanowire, thereby causing re-flow of the exposed body portion.

Example 82 is a method of cleaning a semiconductor structure, the method comprising providing a semiconductor material with a sacrificial material layer thereon; removing the sacrificial material layer; and performing at least one cycle of digital etch on the semiconductor material.

Example 83 includes the subject matter of Example 82, wherein the cycle of digital etch comprises forming a surface layer on the semiconductor material, the surface layer being a compound formed with the semiconductor material and having a thickness no greater than 10 Å, and removing the surface layer from the semiconductor material.

Example 84 includes the subject matter of any of Examples 82 or 83, wherein the semiconductor material consists essentially of silicon and the sacrificial layer comprises silicon and germanium.

Example 85 includes the subject matter of Example 84, wherein the surface layer comprises silicon and oxygen.

Example 86 includes the subject matter of any of Examples 82-85, wherein the at least one cycle of digital etch includes two or more cycles of digital etch.

Example 87 is an integrated circuit die comprising the transistor structure of any of Examples 1-19.

Example 88 includes the subject matter of Example 87, wherein the transistor structure is one of a plurality of transistors including one or more NMOS transistor and one or more PMOS transistor.

Example 89 is an integrated circuit comprising one or more semiconductor structure of any of Examples 1-68.

Example 90 includes the subject matter of Examples 89, and further comprises a processor.

Example 91 includes the subject matter of Example 89, and further comprises a memory structure.

Example 92 includes the subject matter of any of Examples 89-91, wherein the at least one transistor structure includes at least one of a field-effect transistor (FET), metal-oxide-semiconductor FET (MOSFET), tunnel-FET (TFET), a planar configuration, a finned configuration, a Fin-FET configuration, a tri-gate configuration, a nanowire configuration, and a nanoribbon configuration.

Example 93 includes the subject matter of any of Examples 87-92, wherein the at least one transistor includes at least one of a n-channel transistor and a p-channel transistor.

Example 94 includes the subject matter of any of Examples 87-93, further comprising a complementary metal-oxide-semiconductor (CMOS) circuit including a first transistor including the channel region and a second transistor formed above the first layer, wherein one of the first and second transistors is an n-channel transistor and the other of the first and second transistors is a p-channel transistor.

Example 95 is a computing system comprising the integrated circuit of any of Examples 89-95.

Example 96 includes the subject matter of Example 95, and further comprises a communication chip.

Example 97 includes the subject matter of Example 95 or 96, and further comprises a touch screen controller.

Example 98 includes the subject matter of any of Examples 95-97, further comprising dynamic random access memory.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor structure comprising:
a body comprising a semiconductor material;
a subfin beneath the body;
a gate structure wrapped around the body, and the gate structure on a top and along sidewalls of the subfin, the gate structure including a gate electrode and a gate dielectric between the body and the gate electrode, and the gate structure including a gate spacer; and
a source region and a drain region, the body being between the source and drain regions; wherein the body has a first cross-sectional shape under the gate dielectric and a second cross-sectional shape under the gate spacer, wherein the first cross-sectional shape is more rounded than the second cross-sectional shape, and wherein the gate spacer extends vertically beneath the second cross-sectional shape.

2. The semiconductor structure of claim 1, wherein the body comprises a nanowire that has an external size defined by a minimum circumscribed circle and an internal size defined by a maximum inscribed circle, wherein the difference between the external size and the internal size is greater for the second cross-sectional shape than for the first cross-sectional shape.

3. The semiconductor structure of claim 1, wherein the first cross-sectional shape has a first vertical height, the second cross-sectional shape has a second vertical height, and a ratio of the first vertical height to the second vertical height is no greater than 0.9.

4. The semiconductor structure of claim 1, wherein the first cross-sectional shape has a first perimeter length, the second cross-sectional shape has a second perimeter length, and a ratio of the first perimeter length to the second perimeter length is no greater than 0.9.

5. The semiconductor structure of claim 1, wherein the body is a first body, the structure further including one or more additional bodies, each of the first and additional bodies being a nanowire or nanoribbon, and each body having the first cross-sectional shape under the gate dielectric, wherein a perimeter length of the first cross-sectional shape differs by no more than 1.0 nm between any of the bodies.

6. The semiconductor structure of claim 5, wherein the perimeter length of the first cross-sectional shape is less than 40 nm.

7. The semiconductor structure of claim 5, wherein an average perimeter length of the first cross-sectional shape of the first and additional bodies has a standard deviation no greater than 1.0 nm.

8. The semiconductor structure of claim 7, wherein the standard deviation is no greater than 0.5 nm.

9. The semiconductor structure of claim 1, wherein the portion of the body having the second cross-sectional shape has a surface roughness that is greater than a surface roughness of the portion of the body having the first cross-sectional shape.

10. The semiconductor structure of claim 1, wherein the portion of the body having the first cross-sectional shape consists essentially of silicon and the portion of the body having the second cross-sectional shape comprises silicon and germanium.

11. The semiconductor structure of claim of claim 1, wherein the portion of the body having the first cross-sectional shape consists essentially of gallium and the portion of the body having the second cross-sectional shape comprises gallium and arsenic.

12. A nanowire transistor structure comprising:
a first region of semiconductor material;
a second region of semiconductor material;
one or more nanowires having a body between a first end portion in contact with the first region and a second end portion in contact with the second region;
a subfin beneath the body of the one or more nanowires; and
a gate structure around the body of the one or more nanowires, and the gate structure on a top and along sidewalls of the subfin, the gate structure comprising a gate electrode and a gate dielectric between the gate electrode and the body, and the gate structure including a gate spacer;
wherein the body of the one or more nanowires has a first cross-sectional shape and the first end portion has a second cross-sectional shape, wherein the first cross-sectional shape is more rounded than the second cross-sectional shape, and the first cross-sectional shape has a smaller circumference compared to the second cross-sectional shape, and wherein the gate spacer extends vertically beneath the second cross-sectional shape.

13. The nanowire transistor structure of claim 12 further comprising:
a source contact on the first region of semiconductor material; and
a drain contact on the second region of semiconductor material.

14. The nanowire transistor structure of claim 12, wherein the gate structure is a first gate structure, and the nanowire transistor structure further comprising a second gate structure around the body and isolated from the first gate structure by a dielectric.

15. The nanowire device of claim 12, wherein the one or more nanowires have an external size defined by a minimum circumscribed circle and an internal size defined by a maximum inscribed circle, wherein the difference between the external size and the internal size is greater for the second cross-sectional shape than for the first cross-sectional shape.

* * * * *